(12) United States Patent
Bach

(10) Patent No.: US 7,873,191 B2
(45) Date of Patent: Jan. 18, 2011

(54) CAPACITIVE ARRAY

(75) Inventor: Jérôme Bach, Grenoble (FR)

(73) Assignee: STMicroelectronics S.A., Paris Cedex (FR)

( * ) Notice: Subject to any disclaimer, the term of this patent is extended or adjusted under 35 U.S.C. 154(b) by 1274 days.

(21) Appl. No.: 11/420,152

(22) Filed: May 24, 2006

(65) Prior Publication Data

US 2006/0270145 A1 Nov. 30, 2006

(30) Foreign Application Priority Data

May 25, 2005 (FR) .................... 05 05267

(51) Int. Cl.
*G06K 9/00* (2006.01)
*H01G 5/01* (2006.01)
*G01P 15/125* (2006.01)
*G01R 27/28* (2006.01)

(52) U.S. Cl. ................. 382/124; 382/116; 361/278; 73/514.32; 324/661

(58) Field of Classification Search .......... 382/116, 382/124, 107, 115; 73/514.12, 514.32; 324/661, 324/658, 649; 438/50, 52, 71, 72, 53; 361/277, 361/278, 283.1, 271, 303; 716/10; 345/168, 345/173, 179; 901/47, 46
See application file for complete search history.

(56) References Cited

U.S. PATENT DOCUMENTS

| | | | |
|---|---|---|---|
| 4,093,892 A * | 6/1978 | Vanderplaats | 315/3.5 |
| 5,208,725 A | 5/1993 | Akcasu | |
| 5,373,245 A * | 12/1994 | Vranish | 324/662 |
| 5,583,359 A | 12/1996 | Ng et al. | |
| 6,000,280 A * | 12/1999 | Miller et al. | 73/105 |
| 6,111,742 A | 8/2000 | Bonhoure | |
| 6,473,713 B1 * | 10/2002 | McCall et al. | 702/141 |
| 6,541,831 B2 * | 4/2003 | Lee et al. | 257/415 |
| 6,542,351 B1 | 4/2003 | Kwang | |
| 7,099,496 B2 * | 8/2006 | Benkley, III | 382/124 |
| 7,146,024 B2 * | 12/2006 | Benkley, III | 382/107 |
| 7,256,589 B2 * | 8/2007 | Andrade | 324/687 |
| 2003/0183864 A1 | 10/2003 | Miyazawa | |
| 2004/0205679 A1 | 10/2004 | Drennan | |

OTHER PUBLICATIONS

FR Search Report FR 050 5267; Feb. 27, 2006.

* cited by examiner

*Primary Examiner*—Sheela C Chawan
(74) *Attorney, Agent, or Firm*—William J. Kubida; Peter J. Meza; Hogan Lovells US LLP

(57) ABSTRACT

A capacitive array comprising at least two capacitive entities, comprising a substrate layer. The substrate layer comprises a comb comprising at least four substantially identical teeth, and, for each capacitive entity, a set of fingers comprising one or more interlinked fingers. At least two sets of fingers comprise a different number of fingers, each finger being nested between two teeth of the comb and being substantially identical to the other fingers. The fingers of each set of fingers are substantially distributed symmetrically relative to a median axis of the comb. The comb and the fingers are integrated in a single block.

17 Claims, 3 Drawing Sheets

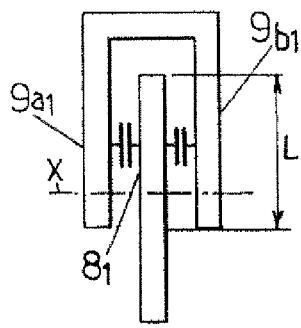
FIG.6A.
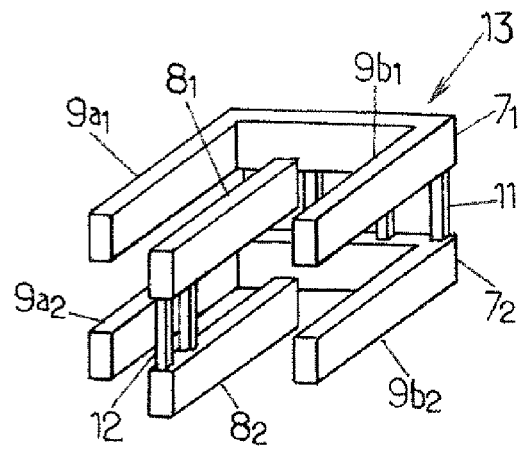
FIG.6B.
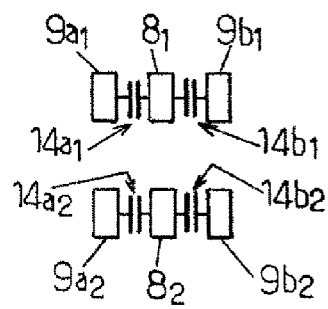
FIG.6C.
FIG.7.
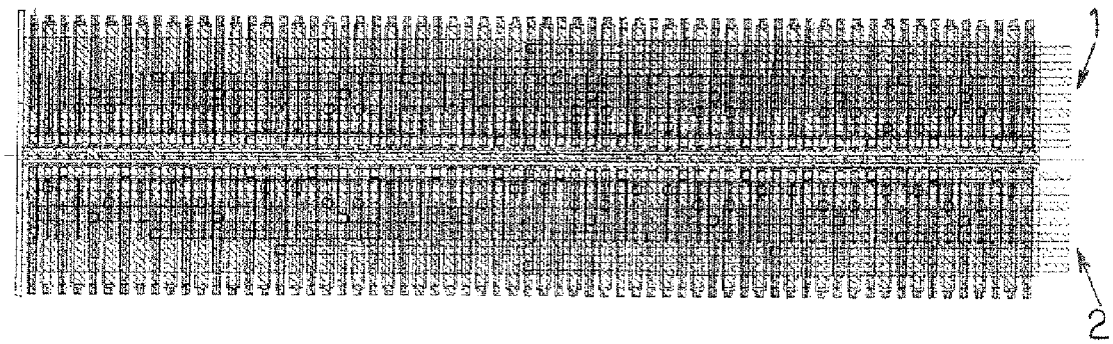

CAPACITIVE ARRAY

RELATED APPLICATION

The present application claims priority of French Patent Application No. 05 05267 filed May 25, 2005, which is incorporated herein in its entirety by this reference.

FIELD OF THE INVENTION

The invention relates to the field of capacitive arrays.

BACKGROUND OF THE INVENTION

Capacitive arrays, also called arrays with charge distribution, are routinely used in various applications, for example in analogue to digital converters (ADC). A capacitive array comprises at least two capacitive entities of different values.

FIG. 1 shows an example of capacitive array. The capacitive array 1 comprises a number of capacitive entities ($C_1$, $C_2$, $C_3$, $C_4$, $C_5$). Each capacitive entity ($C_1$, $C_2$, $C_3$, $C_4$, $C_5$) has a first terminal and a second terminal. The first terminals of the capacitive entities ($C_1$, $C_2$, $C_3$, $C_4$, $C_5$) are interlinked. The reference Vc denotes the electrical potential at the first terminals of the capacitive entities ($C_1$, $C_2$, $C_3$, $C_4$, $C_5$). The second terminals of the capacitive entities ($C_1$, $C_2$, $C_3$, $C_4$, $C_5$) are not necessarily interlinked. The second terminal of each capacitive entity $C_i$ may be subject to an associated electrical potential $V_i$. The electrical potentials $V_i$ may take values that are different from each other.

A parameter determining the operation of a capacitive array is the ratio of the values of the capacitive entities to each other, for example $C_3/C_1$. Currently, efforts are directed towards producing capacitive arrays such that the ratio of the values of the capacitive entities has a value as accurate as possible.

Producing capacitive arrays using plate capacitors is known. U.S. Pat. No. 6,111,742 discloses an example of metal-oxide-metal (MOM) plate capacitor.

Plate capacitors are normally quite large in order to be able to adjust the values of the capacitors as much as possible. Because of this, these capacitors have relatively high values. The capacitive entities thus have relatively accurate values.

Furthermore, when fabricating such capacitive arrays, each capacitive entity is integrated in an associated block. A block comprises an area of the surface of a substrate normally dedicated to a given function, in this case a capacitive entity. Each block is located apart from the other blocks, the distance between two blocks being normally imposed by the fabrication constraints. The capacitive array is therefore structured as a number of blocks of equal dimensions. Fabricating such an array from blocks is relatively simple because of this similarity between the blocks.

FIG. 2 is an example of a top-view diagram of two capacitive arrays, each comprising twelve capacitive entities. Each block 3a, 3b, etc. of each capacitive array 1, 2 comprises an associated capacitive entity, Connections 4 interlink the capacitive entities of one and the same capacitive array.

Also known, for example from U.S. Pat. No. 5,208,725, is the production of fringe capacitors. FIG. 3 shows an example of a capacitive entity produced with fringe capacitors, according to the prior art.

A given capacitive entity 5 comprises a first comb 6 and a second comb 7 nested in each other. In FIG. 3, the second comb 7 is double. The value of the capacitive entity is equal to the sum of the values of the fringe capacitors between the teeth of the combs, in the direction X orthogonal to the axis of the teeth of the comb. This type of capacitor has the advantage of occupying less space than a plate capacitor for a given capacitance value.

SUMMARY OF THE INVENTION

An object of the present invention is to further reduce the space occupied by a given capacitive array.

The present invention provides a capacitive array comprising at least two capacitive entities. The capacitive array comprises a substrate layer comprising a comb comprising at least four substantially identical teeth, and, for each capacitive entity, a set of fingers comprising one or more interlinked fingers, at least two sets of fingers comprising a different number of fingers. Each finger is nested between two teeth of the comb and is substantially identical to the other fingers. The comb and the fingers are integrated in a single block.

Thus, a number of capacitive entities of the capacitive array are integrated in a single block. The capacitive arrays of the prior art comprise as many blocks as there are capacitive entities. The fabrication constraints impose a relatively large minimum distance between the blocks, so the capacitive arrays of the prior art occupy a relatively large area because of the number of blocks. With the capacitive arrays according to the invention, the limiting distance is the minimum distance between two fingers, that is, a smaller distance than the minimum distance between the blocks.

Furthermore, the capacitive arrays according to the prior art, because of their size and in particular because of the interconnections between the blocks, present relatively high stray capacitances. These arrays therefore have a relatively low operating speed, and attenuations because of the stray capacitance values. With a capacitive array according to the invention, the fingers and the teeth, that is, the elements involved in the operation of the array, are integrated in a single block. The stray capacitances within the block are relatively low. The ratios of the values of the capacitive entities and therefore the operation of the array are therefore relatively unaffected.

A fringe capacitor is generated between each finger and the teeth between which this finger is nested. The value of a capacitive entity is substantially equal to the sum of the values of the fringe capacitors generated by the fingers of the set of fingers corresponding to this capacitive entity. Each capacitive entity has an integer number of substantially identical fingers, so the ratios of the values of the capacitive entities are relatively accurate.

Advantageously, each set of fingers is constructed from a basic element comprising a single finger. Each set of fingers is made up of a whole number of basic elements. For a capacitive array with a single substrate layer, the value of the basic element is defined as the smallest non-zero value out of the lowest capacitive entity value and the remainders from divisions of the values of each capacitive entity by the values of the or each other capacitive entity.

Thus, the basic element occupies a relatively small volume. For example, a capacitive array with a first capacitive entity having a first value, and a second capacitive entity having a second value equal to half of the first value, may be produced with a comb with four teeth and three fingers. The basic element then comprises one finger, the value of the basic element here being equal to the smallest capacitive entity value. The first capacitive entity comprises the other two teeth.

For a capacitive array with a first capacitive entity having a first value, and a second capacitive entity having a second value equal to two thirds of the first value, the value of the basic element is equal to a third of the first value. The first capacitive entity therefore has three fingers and the second capacitive entity has two fingers.

This characteristic is, of course, by no means limiting: the basic element may comprise a plurality of fingers. A given capacitive array produced with a basic element with, for example, two fingers, has twice as many fingers as it would have if the basic element had a single finger.

Advantageously, the fingers of each set of fingers are distributed substantially symmetrically relative to a median axis of the comb.

When a block is fabricated, some stresses are not applied uniformly to the entire block, thus creating a transverse pressure gradient. The pressure normally varies substantially linearly with length. The pressure gradient may lead to local variations in the capacitor values. In the capacitive array according to the prior art, each block has only a single capacitive entity, so the local variations are averaged. The overall value of the capacitive entity is thus relatively unaffected by the local variations.

By distributing the fingers corresponding to a given capacitive entity either side of the median axis, the present invention compensates at least partly for the gradient effects. Similarly, the overall value of each capacitive entity of the block is thus relatively unaffected by the local variations.

When a capacitive array includes a capacitive entity which has but a single finger, this finger is positioned substantially on the median axis.

Naturally, when a number of capacitive entities comprise an odd number of fingers, the fingers will be only roughly distributed symmetrically relative to the median axis. The substantially symmetrical distributing of the fingers relative to a median axis of the comb hence allows compensating at least partly for the gradient effects.

The present invention is, of course, by no means limited by the distribution of the fingers.

Advantageously, the value of each capacitive entity is chosen to be equal to the smallest capacitive entity value multiplied by an integer power of two. Thus, the distribution of the fingers either side of the median axis is relatively easy. Furthermore, such a capacitive array finds advantageous application in analogue to digital converters (ADC). This characteristic is, of course, by no means limiting.

BRIEF DESCRIPTION OF THE DRAWINGS

Other features and advantages of the present invention will become apparent from the description that follows.

FIGS. 6A, 6B and 6C are three views—respectively from above, in perspective and in cross section—of an exemplary capacitive unit of a capacitive array according to a third embodiment of the present invention.

FIG. 7 is a diagram of an example of two capacitive arrays, each comprising 95 fingers in total, according to the present invention.

DETAILED DESCRIPTION

Figure 4:
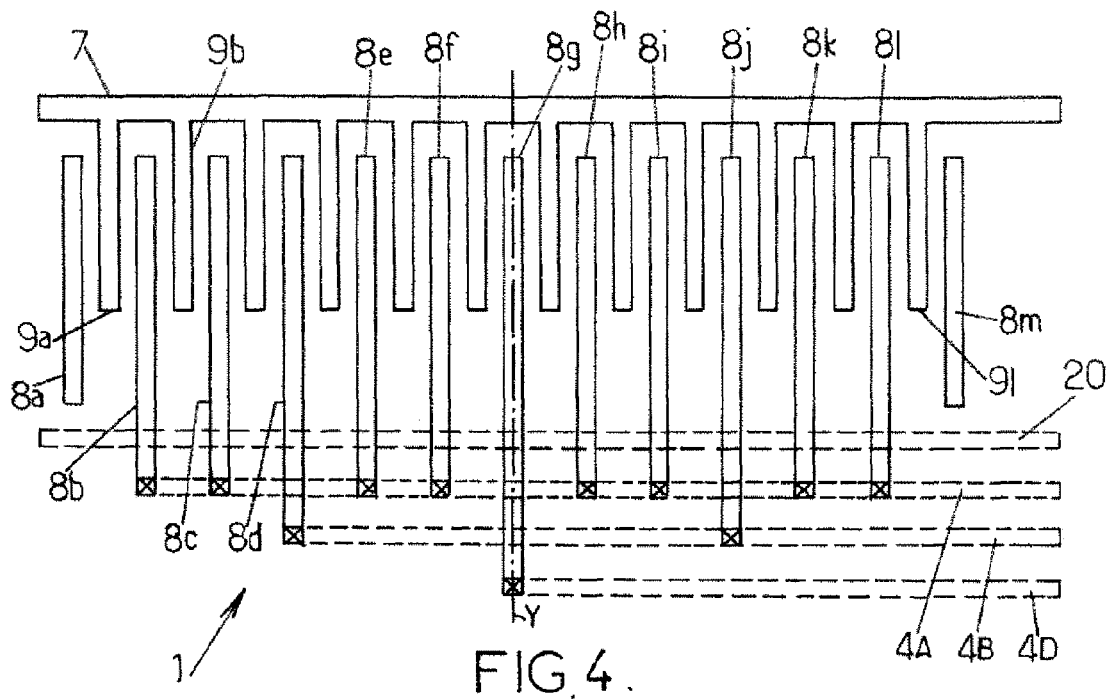
FIG. 4 shows an example of capacitive array according to a first embodiment of the present invention.

The capacitive array 1 represented in FIG. 4 comprises a substrate layer with a comb 7. The comb 7 here has twelve substantially identical teeth $9a, 9b, \ldots, 9l$. In this example, the capacitive array 1 also comprises three capacitive entities.

A first capacitive entity comprises a first set of fingers with eight fingers $8b, 8c, 8e, 8f, 8h, 8i, 8k$ and $8l$. These eight fingers are interlinked by a first connecting track $4_A$.

A second capacitive entity comprises a second set of fingers with two fingers $8d$ and $8j$. These two fingers are interlinked via a second connecting track $4_B$. The fingers of the capacitive array are substantially identical to each other, so the value of the second capacitive entity is substantially equal to a quarter of the value of the first capacitive entity.

A third capacitive entity comprises a third set of fingers with a single finger $8g$, linked to a third connecting track $4_D$. The value of the third capacitive entity is substantially equal to an eighth of the value of the first capacitive entity.

Two dummy fingers $8a, 8m$ are provided to give the teeth at the lateral extremities $9a$ and $9l$ the perception of an environment substantially similar to the environment perceived by the other teeth of the comb 7.

Each finger of a set of fingers forms, with the corresponding adjacent teeth, a capacitive unit. The first capacitive entity corresponds to eight capacitive units. The second capacitive entity corresponds to two capacitive units and the third capacitive entity corresponds to a single capacitive unit.

The value associated with a capacitive unit depends on its geometry. It is therefore possible to adjust various parameters, for example, the length of the fingers, to modify the value associated with the capacitive units. The capacitive array may comprise a number of substrate layers, as is shown in FIGS. 6A, 6B and 6C. It is therefore possible to adjust the number of layers to modify the geometry of the capacitive units and, consequently, the values associated with the capacitive units.

The value associated with a capacitive unit may, for example, be 200 attofarads.

For each capacitive entity, the corresponding fingers are distributed substantially symmetrically relative to a median axis Y. For example, the finger of the third capacitive entity $8g$ is located substantially on the median axis Y, whereas the fingers of the second capacitive entity $8d$ and $8j$ are located either side of the median axis Y, and substantially equidistant from the median axis Y. This distribution at least partially compensates for the variations in the capacitance values due to a gradient.

The first connecting track $4_A$, the second connecting track $4_B$ and the third connecting track $4_D$ form a set of connecting tracks. In the first embodiment, this set of connecting tracks extends in the plane of the substrate layer. Naturally, these connecting tracks $4_A$, $4_B$ and $4_D$ may create stray capacitances. However, these connecting tracks $4_A$, $4_B$ and $4_D$ are located relatively far away from the elements involved in the operation of the array, that is, the teeth and the fingers. Consequently, these stray capacitances have relatively little effect on the operation of the capacitive array.

On implementation, the connecting tracks $4_A$, $4_B$ and $4_D$ are located outside the block in which the comb 7 and the fingers $8a, \ldots, 8m$ are integrated.

As is shown in FIGS. 6A, 6B and 6C, the capacitive array may comprise the substrate layer and one or more additional substrate layers. In this case, the set of connecting tracks may belong to one and the same plane. The set of connecting tracks may, for example, extend in the plane of the substrate layer only. The set of connecting tracks and the or each additional substrate layer thus belong to different planes.

A lateral screen element, referenced 20 in FIG. 4, may then be used to insulate at least one additional substrate layer from the set of connecting tracks. Thus, the stray capacitances generated by the connecting tracks $4_A$, $4_B$ and $4_D$ have relatively little effect on the ratios of the values of the capacitive entities.

This lateral screen element 20 may be substantially flat. In FIG. 4, the lateral screen element 20 is seen from the side. The lateral screen element 20 may be oriented such that the plane of the lateral screen element is substantially perpendicular to the plane of FIG. 4.

The lateral screen element may be made of metal, for example of aluminium or copper. The lateral screen element may, for example, be made of the same metal as the comb and the fingers.

Figure 5:
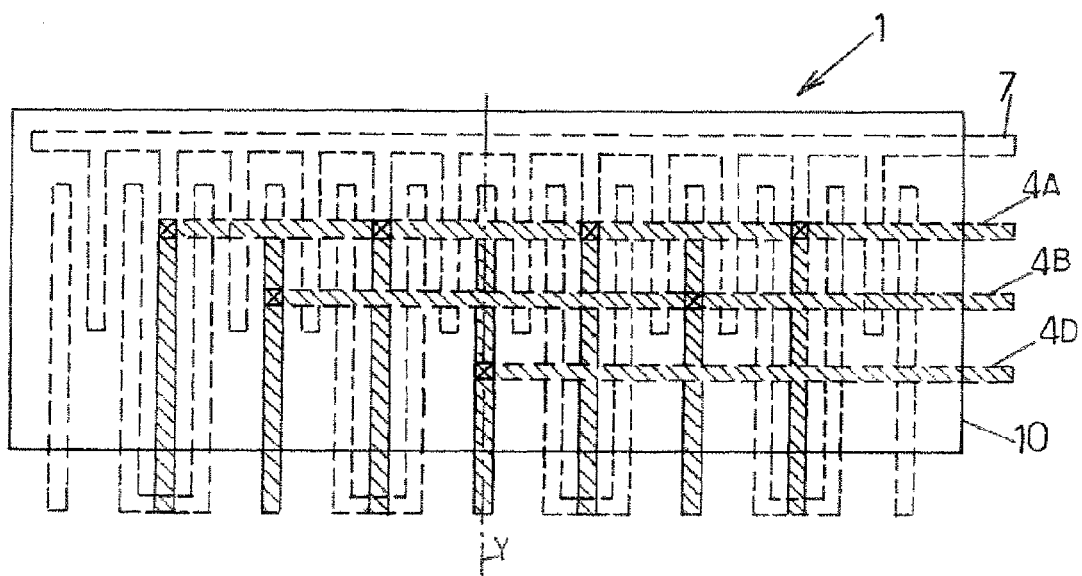
FIG. 5 shows an example of capacitive array according to a second embodiment of the present invention.

FIG. 5 shows an example of capacitive array according to a second embodiment of the present invention. Just like the capacitive array represented in FIG. 4, the capacitive array represented in FIG. 5 has three capacitive entities presenting the same ratios of capacitance values. Each capacitive entity has fingers nested between the teeth of a comb 7. The fingers and the teeth of the comb 7 belong to one and the same substrate layer.

In a second embodiment, the capacitive array 1 also has a set of connecting tracks $4_A$, $4_B$ and $4_D$ above the substrate layer. A surface screen element 10 allows to insulate the substrate layer from the connecting tracks $4_A$, $4_B$ and $4_D$. Thus, the stray capacitances generated by the connecting tracks $4_A$, $4_B$ and $4_D$ have relatively little effect on the ratios of the values of the capacitive entities. This surface screen element 10 may be substantially flat. The surface screen element 10 may be made of metal, for example of aluminium or copper. The surface screen element may, for example, be made of the same metal as the comb and the fingers.

This structure presents the advantage of being relatively compact.

The surface screen element 10 may also allow to retain the symmetry relative to the median axis of the active elements of the capacitive array, that is, of the comb 7 and of the fingers since the connecting tracks are insulated.

The term "above" should be understood to mean that the substrate layer and the set of connecting tracks are stacked, so that the word "above" is used to mean both the word "above" in the common sense of the word and the word "below" in the common sense of the term.

FIGS. 6A, 6B and 6C are three views of an example of a capacitive unit of a capacitive array according to a third embodiment of the present invention. FIG. 6A is a plan view, FIG. 6B is a perspective view and FIG. 6C is a side view. These three figures will be explained together.

A capacitive array comprises a number of capacitive entities of different values. Each capacitive entity comprises at least one capacitive unit 13. The capacitive entities are constructed from capacitive units. Each capacitive entity is made up of a whole number of capacitive units.

The capacitive unit 13 comprises two teeth $9a_1$ and $9b_1$ of a comb $7_1$ and a finger $8_1$ nested between these teeth $9a_1$ and $9b_1$. This comb $7_1$ and this finger $8_1$ belong to a given substrate layer. For each capacitive entity, this substrate layer comprises a set of fingers. Advantageously, each set of fingers is constructed from a basic element with just one finger.

As illustrated in FIGS. 6A and 6C, the teeth $9a_1$ and $9b_1$ and the finger $8_1$ generate fringe capacitors $14a_1$, $14b_1$.

The values of these capacitors may be modified by adjusting the geometry of the teeth $9a_1$ and $9b_1$ and of the finger $8_1$, for example by modifying the length L of a capacitive area.

According to a third embodiment of the present invention, the capacitive array also comprises an additional substrate layer comprising an additional comb $7_2$, and, for each finger, an additional finger nested in the teeth of the additional comb $7_2$. The capacitive unit 13 therefore also comprises two additional teeth $9a_2$ and $9b_2$ and an additional finger $8_2$. As illustrated in FIG. 6C, four fringe capacitors $14a_1$, $14b_1$, $14a_2$ and $14b_2$ are thus generated.

The capacitive array also comprises first link elements between the comb $7_1$ and the additional comb $7_2$, for example a first via 11. The capacitive array also comprises second link elements between each finger $8_1$ and the corresponding additional finger $8_2$, for example a second via 12. Thus, the combs $7_1$ and $7_2$ are interlinked, as are the fingers $8_1$ and $8_2$. Thus, the capacitive unit 13 formed by the finger $8_1$, the corresponding additional finger $8_2$ and the corresponding adjacent teeth $9a_1$, $9b_1$, $9a_2$ and $9b_2$ presents a value substantially equal to four times the value of a fringe capacitor ($14a_1$, $14b_1$, $14a_2$, $14b_2$) such as those represented in FIG. 6C. The capacitive arrays according to the third embodiment of the invention are thus relatively compact.

The capacitive array may also comprise other additional substrate layers (not shown), such that it is possible to adjust the number of substrate layers to modify the value associated with a capacitive unit.

The basic element advantageously comprises a single finger, such that a capacitive unit comprises a single finger for each substrate layer. The capacitive unit represented in FIG. 6B therefore comprises two fingers.

The embodiments illustrated in FIGS. 4, 5, 6A, 6B and 6C represent only exemplary embodiments and are by no means limiting on the present invention.

FIG. 7 is an exemplary diagram of two capacitive arrays each including 95 fingers in total, according to an embodiment of the present invention.

Figure 1:
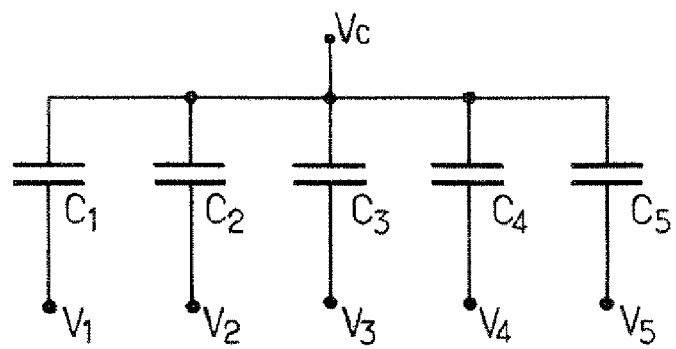
FIG. 1, already described, shows an example of capacitive array known from the prior art.
Figure 2:
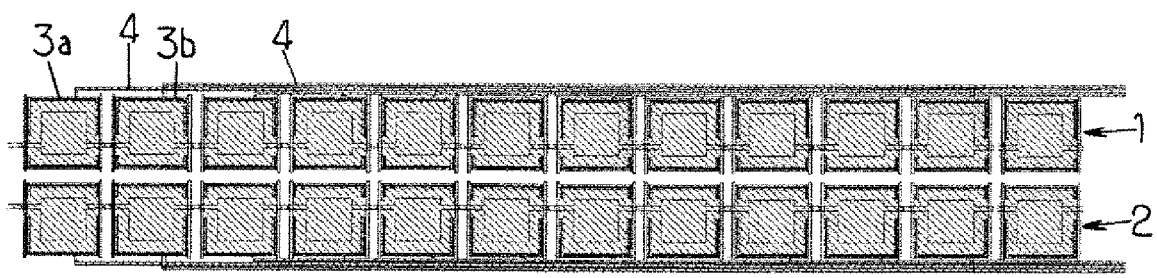
FIG. 2, already described, is a diagram of an example of two capacitive arrays, each comprising twelve capacitive entities, according to the prior art.
Figure 3:
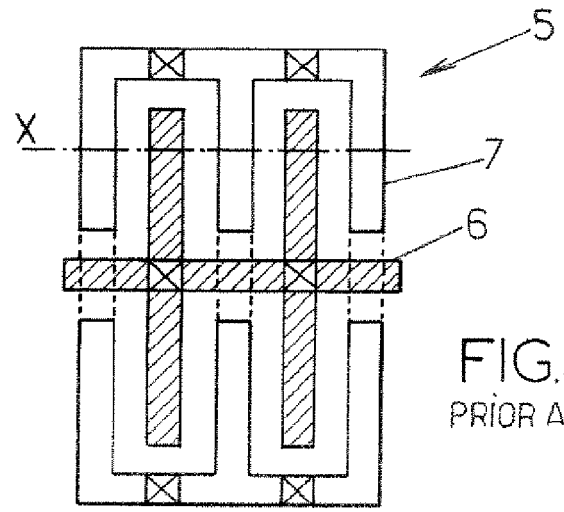
FIG. 3, already described, shows an example of a capacitive entity produced with fringe capacitors, according to the prior art.

For each capacitive array 1, 2, each of the 95 fingers belongs to a set of fingers. The fingers of one and the same set of fingers are interlinked by connecting tracks above the substrate layer of the fingers. Each finger is nested between two teeth of a comb. The comb and the fingers are integrated in a single block, such that the duly created capacitive array has a relatively small size, unlike the capacitive arrays according to the prior art, for example, the capacitive array illustrated by FIG. 2. The capacitive arrays according to the invention may occupy approximately four times less space than the capacitive arrays according to the prior art, for similar operating characteristics.

A capacitive array as described previously may be used in a digital-analogue converter (DAC) circuit, the DAC circuit itself being integrated in an analogue to digital converter (ADC). A capacitive array for a DAC normally comprises a relatively high number of capacitive entities. The value of the basic element must be relatively low in order to avoid having too high a capacitive entity value. The capacitive arrays according to the present invention, with a basic unit reduced to one finger, therefore find a particularly advantageous application in DACs. The value associated with the basic unit may, in practice, be relatively low.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

The invention claimed is:

1. A capacitive array having at least two capacitive entities, comprising:
   a substrate layer comprising:
   a comb including at least four substantially identical teeth; and
   for each capacitive entity, a set of fingers with one or more interlinked fingers, at least two sets of fingers comprising a different number of fingers, each finger being nested between two teeth of the comb and being substantially identical to the other fingers, the fingers of each set of fingers being substantially distributed symmetrically relative to a median axis of the comb, wherein the comb and the fingers are integrated in a single block.

2. A capacitive array according to claim 1, further comprising:
   a set of connecting tracks above the substrate layer; and
   a surface screen element between the substrate layer and the connecting tracks.

3. A capacitive array according to claim 1, wherein each set of fingers is constructed from a basic element comprising a single finger.

4. A capacitive array according to claim 3, further comprising:
   a set of connecting tracks above the substrate layer; and
   a surface screen element between the substrate layer and the connecting tracks.

5. A capacitive array according to claim 1, wherein the value of each capacitive entity is chosen to be equal to the value of the lowest capacitive entity multiplied by an integer power of two.

6. A capacitive array according to claim 5, further comprising:
   a set of connecting tracks above the substrate layer; and
   a surface screen element between the substrate layer and the connecting tracks.

7. A capacitive array according to claim 1, further comprising a set of connecting tracks extending in the plane of the substrate layer.

8. A capacitive array according to claim 7, further comprising:
   an additional substrate layer below the substrate layer, comprising:
   an additional comb substantially identical to the comb and for each finger, an additional finger nested in the teeth of the additional comb;
   first link elements between the comb and the additional comb; and
   second link elements between each finger and the corresponding additional finger.

9. A capacitive array according to claim 8 further comprising a lateral screen element between the additional substrate layer and the connecting tracks.

10. A capacitive array according to claim 1, further comprising:
    an additional substrate layer below the substrate layer, comprising:
    an additional comb substantially identical to the comb and for each finger, an additional finger nested in the teeth of the additional comb;
    first link elements between the comb and the additional comb; and
    second link elements between each finger and the corresponding additional finger.

11. A digital to analogue converter comprising a capacitive array including at least two capacitive entities, comprising:
    a substrate layer comprising:
    a comb including at least four substantially identical teeth; and
    for each capacitive entity, a set of fingers with one or more interlinked fingers, at least two sets of fingers comprising a different number of fingers, each finger being nested between two teeth of the comb and being substantially identical to the other fingers, the fingers of each set of fingers being substantially distributed symmetrically relative to a median axis of the comb, wherein the comb and the fingers are integrated in a single block.

12. An analogue to digital converter comprising a digital-analogue converter according to claim 11.

13. A capacitive array comprising:
    a comb including a plurality of substantially identical teeth; and
    a plurality of sets of fingers with one or more interlinked fingers, at least two sets of fingers comprising a different number of fingers, each finger being nested between two teeth of the comb and being substantially identical to the other fingers, the fingers of each set of fingers being substantially distributed symmetrically relative to a median axis of the comb, wherein the comb and the fingers are integrated in a single block.

14. A capacitive array according to claim 13, further comprising:
    a set of connecting tracks above a substrate layer including the capacitive array; and
    a surface screen element between the substrate layer and the connecting tracks.

15. A capacitive array according to claim 13, wherein each set of fingers is constructed from a basic element comprising a single finger.

16. A capacitive array according to claim 13, wherein the capacitive array includes a capacitive entity having only a single finger, said finger being positioned substantially on the median axis.

17. A capacitive array according to claim 13, further comprising a plurality of substrate layers.

* * * * *